(12) United States Patent
Zhu et al.

(10) Patent No.: US 11,740,304 B2
(45) Date of Patent: Aug. 29, 2023

(54) MAGNETIC RESONANCE IMAGING METHOD AND SYSTEM FOR SUBJECT WITH METAL IMPLANTS

(71) Applicant: CHENGDU YIJIAN MEDICAL TECHNOLOGY CO., LTD, Chengdu (CN)

(72) Inventors: Ruixing Zhu, Chengdu (CN); Zhizun Zhang, Chengdu (CN); Hangxuan Li, Chengdu (CN)

(73) Assignee: CHENGDU YIJIAN MEDICAL TECHNOLOGY CO., LTD, Chengdu (CN)

( * ) Notice: Subject to any disclaimer, the term of this patent is extended or adjusted under 35 U.S.C. 154(b) by 0 days.

(21) Appl. No.: 17/513,893

(22) Filed: Oct. 29, 2021

(65) Prior Publication Data

US 2022/0137170 A1    May 5, 2022

Related U.S. Application Data

(60) Provisional application No. 63/107,460, filed on Oct. 30, 2020.

(51) Int. Cl.
  *G01R 33/48* (2006.01)
  *G01R 33/483* (2006.01)
  *G01R 33/561* (2006.01)

(52) U.S. Cl.
  CPC ..... *G01R 33/4826* (2013.01); *G01R 33/4835* (2013.01); *G01R 33/5611* (2013.01)

(58) Field of Classification Search
  CPC ............ G01R 33/4826; G01R 33/4835; G01R 33/5611; G01R 33/5617; G01R 33/445; G01R 33/56536
  See application file for complete search history.

(56) References Cited

U.S. PATENT DOCUMENTS

| 6,856,134 | B1 * | 2/2005 | Reeder | G01R 33/4828 |
| | | | | 324/309 |
| 2001/0006345 | A1 * | 7/2001 | Machida | G01R 33/5615 |
| | | | | 324/314 |
| 2018/0172788 | A1 * | 6/2018 | Levine | G01R 33/4835 |
| 2020/0103481 | A1 * | 4/2020 | Koerzdoerfer | G01R 33/543 |
| 2021/0012543 | A1 * | 1/2021 | Hein | G06T 11/008 |
| 2021/0396828 | A1 * | 12/2021 | Ge | G01R 33/543 |

OTHER PUBLICATIONS

Hargreaves et al., Accelerated Slice Encoding for Metal Artifact Correction, 2010, Journal of Magnetic Resonance Imaging, 31:987-996. (Year: 2010).*

(Continued)

*Primary Examiner* — Susan S Lee

(57) ABSTRACT

A computer-implemented magnetic resonance imaging method for subject with a metal implant, including steps of: S1: building an ultra-low field MR system with a field strength ranged from 10 to 100 mT; S2: setting sequences with optimized parameters of the ultra-low field MR system for minimizing the sensitivity to field distortion and improving SNR; S3: magnetic resonance imaging with the ultra-low field MR system using the sequences for the subject with a metal implant to obtain MR images; and S4: improving SNR of obtained MR images by deep learning based image reconstruction.

16 Claims, 4 Drawing Sheets

(56) References Cited

OTHER PUBLICATIONS

Sarracanie et al., Low-Field MRI: How Long Can We Go? A Fresh View on an Old Debate, Jun. 2020, Frontiers in Physics, 8:172. (Year: 2020).*
Kwon et al., A Learning-Based Metal Artifacts Correction Method for MRI Using Dual-Polarity Readout Gradients and Simulated Data, 2018, Korea Advanced Institute of Science and Technology, pp. 189-197. (Year: 2018).*
Butts et al., Reduction of Blurring in View Angle Tilting MRI, 2005, Magnetic Resonance in Medicine, 53:418-424. (Year: 2005).*
Higaki et al., Improvement of Image Quality at CT and MRI using Deep Learning, Japanese Journal of Radiology, 2019, 37:73-80. (Year: 2019).*
Arabi et al., Truncation Compensation and Metallic Dental Implant Artefact Reduction in PET/MRI Attenuation Correction using Deep Learning-Based Object Completion, Physics in Medicine & Biology, Sep. 2020. (Year: 2020).*
Hargreaves et al., Metal-Induced Artifacts in MRI, AJR, 2011,197:547-555. (Year: 2011).*

\* cited by examiner

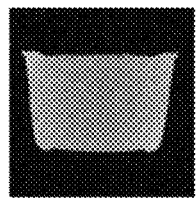 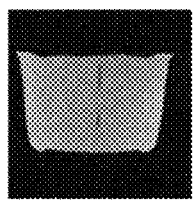 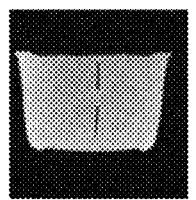 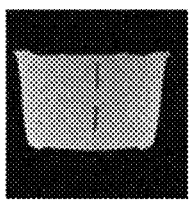 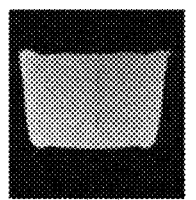
FIG. 3A    FIG. 3B    FIG. 3C    FIG. 3D    FIG. 3E
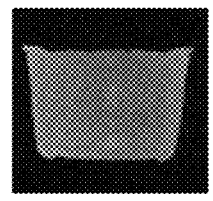 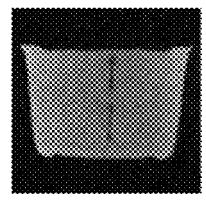 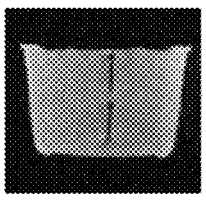 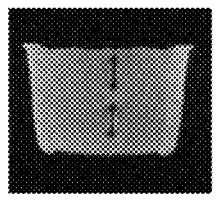 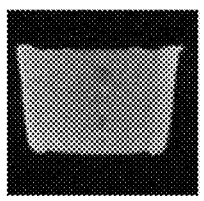
FIG. 4A    FIG. 4B    FIG. 4C    FIG. 4D    FIG. 4E

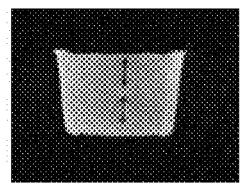
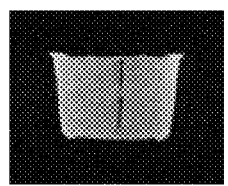
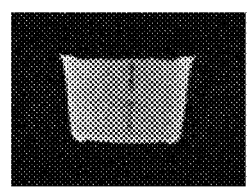
FIG. 5A      FIG. 5B      FIG. 5C
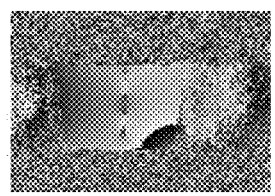
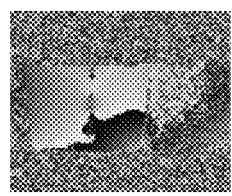
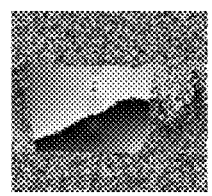
FIG. 6A      FIG. 6B      FIG. 6C

MAGNETIC RESONANCE IMAGING METHOD AND SYSTEM FOR SUBJECT WITH METAL IMPLANTS

CROSS REFERENCE TO RELATED APPLICATIONS

This application claims priority to U.S. Provisional Application No. 63/107,460, entitled "Systems and Methods for Magnetic Resonance Imaging with Metal Implants" filed on Oct. 30, 2020, which is hereby incorporated by reference herein as if set forth in its entirety.

TECHNICAL FIELD

The present disclosure relates to Magnetic Resonance Imaging, and particularly to a magnetic resonance imaging method and system for subject with a metal implant.

BACKGROUND

Magnetic resonance imaging (MM) has impacted modern healthcare tremendously and is recognized by clinicians as the most valuable medical device innovation in the last three decades. Mill is now a routine procedure in diagnosis and management of various diseases and injuries, and over 100 million MM investigations are performed each year worldwide. It is the most powerful diagnostic imaging modality because of its capability in detecting and characterizing pathological tissues with high sensitivity and specificity in an inherently quantitative, non-invasive and non-ionizing manner.

Some patients that are candidates for Mill may have metal elements implanted within their bodies. These metal elements can be surgical implements, including dental elements such as crowns and fillings, fixation devices such as plates, screws and pins, artificial joints such as hip implants and artificial knees, and pacemakers and other implantable electrical devices.

However, metal implants have high intrinsic magnetic susceptibilities that can disturb local magnetic field, causing both in-plane and through-plane changes in resonance frequency. Therefore, image pixels shift away from their true positions, leading to significant geometric distortions, which can also result in signal voids or pile-ups.

SUMMARY

In view of this, an object of the present disclosure is to provide a magnetic resonance imaging method and system for subject with metal implants.

In one aspect, the present disclosure provides a computer-implemented magnetic resonance imaging method for subject with a metal implant, including steps of:

S1: building an ultra-low field MR system with a field strength ranged from 10 to 100 mT;
S2: setting sequences with optimized parameters of the ultra-low field MR system for minimizing the sensitivity to field distortion and improving SNR;
S3: magnetic resonance imaging with the ultra-low field MR system using the sequences for the subject with a metal implant to obtain MR images; and
S4: improving SNR of obtained MR images by deep learning based image reconstruction.

In another aspect, the present disclosure provides a magnetic resonance imaging system for subject with a metal implant, including: a magnet for producing static magnetic field $B_0$ ranged from 10 mT to 100 mT; a plurality of first coils for generating and receiving RF signal; a plurality of second coils for generating gradient magnetic fields for spatial encoding; a console for controlling magnetic gradients and RF receiving and transmission; a power supply system; and a computer for user interaction, wherein the computer comprises: at least one computer hardware processor; at least one non-transitory computer-readable storage medium; and at least one computer program stored in the at least one non-transitory computer-readable storage medium and executable on the at least one computer hardware processor, and wherein when executing the at least one computer program, the at least one computer hardware processor implements the above method.

With the ULF MR system having a field strength of 10 to 100 mT, the field distortion, force, and heating (SAR) caused by metal implants can be minimized, while clinically available image quality can still be achieved. Therefore, the field distortion induced artifacts (including geometrical distortion, signal voids, and pile-ups) can be minimized.

BRIEF DESCRIPTION OF THE DRAWINGS

To describe the technical schemes in the embodiments of the present disclosure or in the prior art more clearly, the following briefly introduces the drawings required for describing the embodiments or the prior art. It should be understood that, the drawings in the following description merely show some embodiments of the present disclosure. For those skilled in the art, other drawings can be obtained according to the drawings without creative efforts.

FIG. 3A shows a representative 3D FSE image from a first slice acquired using the method according to one embodiment of the present disclosure.

FIG. 3B shows a representative 3D FSE image similar to FIG. 3A, but from a second slice.

FIG. 3C shows a representative 3D FSE image similar to FIG. 3A, but from a third slice.

FIG. 3D shows a representative 3D FSE image similar to FIG. 3A, but from a fourth slice.

FIG. 3E shows a representative 3D FSE image similar to FIG. 3A, but from a fifth slice.

FIG. 4A shows a representative 3D GRE image from a first slice acquired using the method according to one embodiment of the present disclosure.

FIG. 4B shows a representative 3D GRE image similar to FIG. 4A, but from a second slice.

FIG. 4C shows a representative 3D GRE image similar to FIG. 4A, but from a third slice.

FIG. 4D shows a representative 3D GRE image similar to FIG. 4A, but from a fourth slice.

FIG. 4E shows a representative 3D GRE image similar to FIG. 4A, but from a fifth slice.

FIG. 5A shows the magnitude of a representative 3D GRE image from a first slice acquired using the method according to one embodiment of the present disclosure.

FIG. 5B shows the magnitude of a representative 3D GRE image similar to FIG. 5A, but from a second slice.

FIG. 5C shows the magnitude of a representative 3D GRE image similar to FIG. 5A, but from a third slice.

FIG. 6A shows the phase of a representative 3D GRE image from a first slice acquired using the method according to one embodiment of the present disclosure.

FIG. 6B shows the phase of a representative 3D GRE image similar to FIG. 6A, but from a second slice.

FIG. 6C shows the phase of a representative 3D GRE image similar to FIG. 6A, but from a third slice.

DETAILED DESCRIPTION

In the following descriptions, for purposes of explanation instead of limitation, specific details such as particular system architecture and technique are set forth in order to provide a thorough understanding of embodiments of the present disclosure. However, it will be apparent to those skilled in the art that the present disclosure may be implemented in other embodiments that are less specific of these details. In other instances, detailed descriptions of well-known systems, devices, circuits, and methods are omitted so as not to obscure the description of the present disclosure with unnecessary detail.

Metal implants can experience strong force at high field, which may cause safety issues. In addition, excitation RF pulses can heat the metal implants, causing heat deposit (i.e., SAR) after long acquisition, especially when narrow excitation RF bandwidth is employed. The inventor found that such risks are significantly lower at ultra-low field.

Therefore, the present disclosure proposes an MRI method for a subject with metal implants, wherein an MR system with ultra-low field is built. At ultra-low field (ULF), SAR is significantly low, and it allows the use of high excitation RF bandwidth, which is helpful in reducing through-plane distortion.

It is found that at ultra-low field with a field strength of 10 mT to 100 mT, clinically acceptable image equality can still be achieved. It is noted that at ultra-low field, T1 values of most biological tissue are significantly shorter compared to that at high field, their T2* values are longer, while their T2 values remain similar. This suggests that at ULF, much shorter TR (time of repetition) and larger flip angle can be used, this can be used to compensate the SNR reduction at ULF. Besides, the MIll scan risks on patients with metal implants (such as heating and implant displacements) are reduced.

Figure 1:
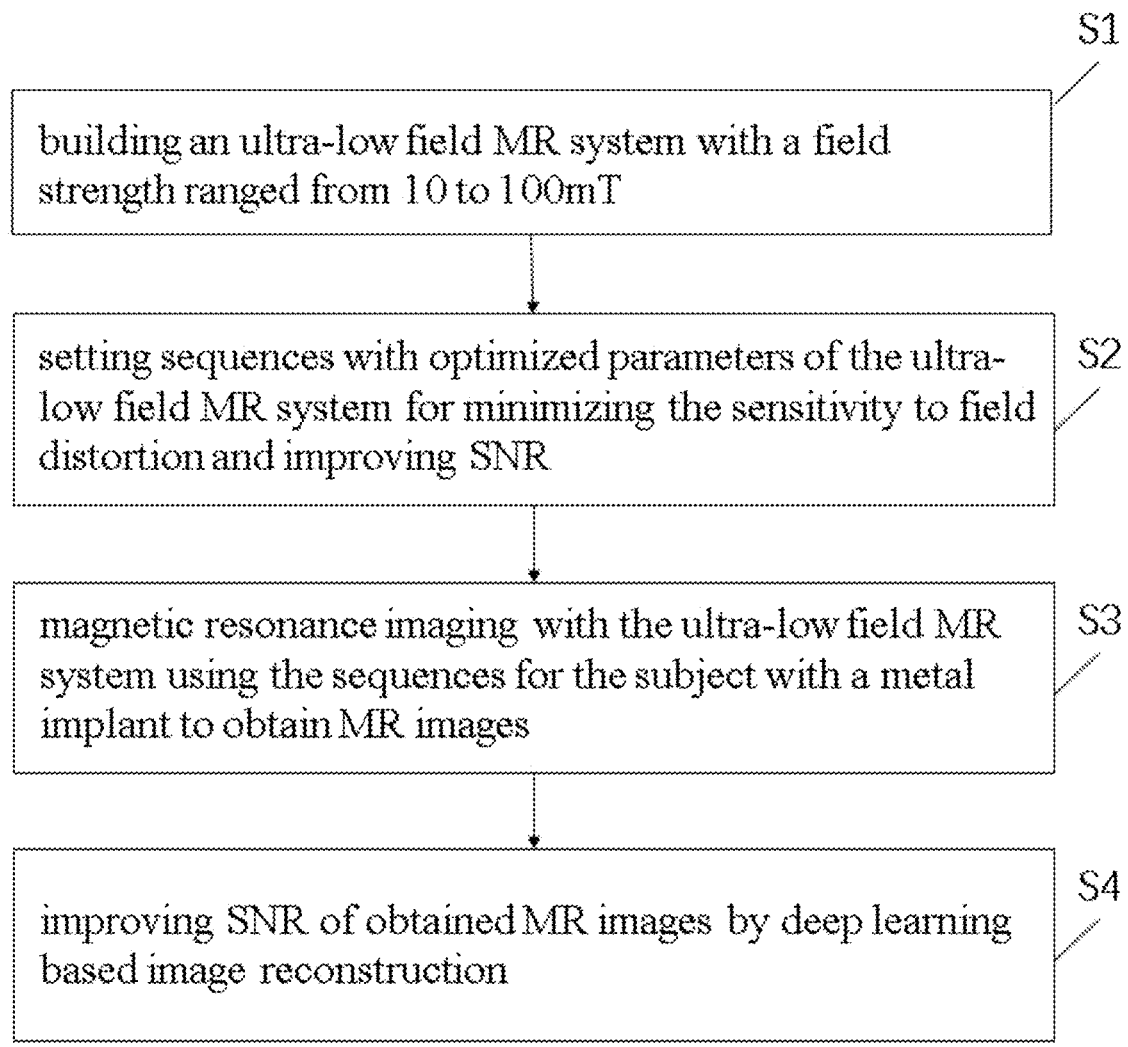
FIG. 1 is a flow chart of a magnetic resonance imaging method for subject with a metal implant according to an embodiment of the present disclosure.

Referring to FIG. 1, a computer-implemented MM method for subject with metal implants according to an embodiment of the present disclosure is shown.

The method includes the following steps:

S1: building an ultra-low field MR system with a field strength ranged from 10 to 100 mT;

S2: setting sequences with optimized parameters of the ultra-low field MR system for minimizing the sensitivity to field distortion and improving SNR;

S3: magnetic resonance imaging with the ultra-low field MR system using the sequences for the subject with a metal implant to obtain MR images; and S4: improving SNR of obtained images by deep learning based image reconstruction.

With the ULF MR system having a field strength of 10 to 100 mT, the field distortion, force, and heating (SAR) caused by metal implants can be minimized, while clinically available image quality can still be achieved. Therefore, the field distortion induced artifacts (including geometrical distortion, signal voids, and pile-ups) can be minimized.

In some embodiments, the MR system includes the following components: a magnet to produce static magnetic field $B_0$ ranged from 10 mT to 100 mT, a plurality of first coils to generate and receive RF signal, a plurality of second coils to generate gradient magnetic fields for spatial encoding, a console for controlling the magnetic gradients and RF receiving and transmission, a computer such as PC, laptop, or tablet for user interaction, and a power supply system.

In particular, the magnet may be permanent magnet, electromagnet, or super-conducting magnet to generate such field strength.

As for step S2, sequences with optimized parameters for minimizing sensitivity to field distortion and improving SNR are developed. Compared to sequences used for high field systems, the sequences at ULF can be optimized with reduced TR and use of more number of signal average and optimizing flip angle, so as to achieve high SNR.

In some embodiments, setting the sequences with optimized parameters for minimizing field distortion may include one or more of the following:

S21: minimizing echo spacing for fast spin echo sequence (FSE), as the multiple refocusing pulses applied at minimum time intervals will partially reduce magnetic field inhomogeneity related dephasing;

S22: maximizing excitation RF bandwidth to reduce through-plane distortion;

S23: maximizing receiver bandwidth to reduce in-plane distortion with a clinically acceptable level of SNR; and S24: reducing slice thickness and using parallel imaging acceleration.

On both slice selection and readout, the spatial distortion is inversely proportional to the gradient strength, which scales with the bandwidth. Some systems will allow the use of increased bandwidth radiofrequency slice-selection pulses, which will reduce through-plane distortion. Increased RF bandwidth, however, comes at a cost of increased power deposition, which may either force longer TRs or fewer interleaved slices per repetition. Using ultra-low field can minimize SAR, therefore allows the use of maximum RF bandwidth without sacrificing acquisition efficiency.

In some embodiments, deep learning based image reconstruction is used for improving the SNR of the reconstructed images. As for the deep learning based image reconstruction, a deep learning model, for example, a neural network architecture, is designed and trained. The input/output of the trained deep learning model can be multiple 2D or a 3D k-space data or images. To further enhance its performance, input can be k-space data or images with multiple contrasts acquired with identical geometry, and images with multiple contrasts can be jointly reconstructed.

The deep learning network architecture may be convolutional neural network (CNN), generative adversarial network (GAN), Auto-Encoder, or other alternatives. In the training process, the models can be trained with simulated MR data, data acquired with the same system, or high field systems.

Take the convolutional neural network as an example. The model can be trained with a complex image data, for example, with a size of 256×256×2×2, wherein the length of the last dimension is 2 to represent the real part channel and the imaginary part channel respectively. The output of the convolutional neural network model is 256×256×2×2 residual image data, corresponding to the real and imaginary parts of the residual image data. The convolutional neural network model includes five convolutional layers and activation functions, namely, 9×9 convolutional layer, ReLu activation layer, 7×7 convolutional layer, ReLu activation layer; 5×5 convolutional layer, ReLu activation layer, 5×5 convolutional layer, ReLu activation layer, 3×3 convolutional layer, and the corresponding output channels of each convolutional layer are 128, 64, 32, 32, and 2, respectively. When training the model, the ADAM or SGD optimizer can be used to minimize the loss function, and choose Mean Squared Error (MSE) to increase the training efficiency during learning using the convolutional neural network, and thus to increase the SNR.

Preferably, the reconstructed images can be denoised to further improve SNR. As such, the method according to the present disclosure may include the step of:
S5: denoising reconstructed images obtained from S4 to further improve SNR.

Figure 2:
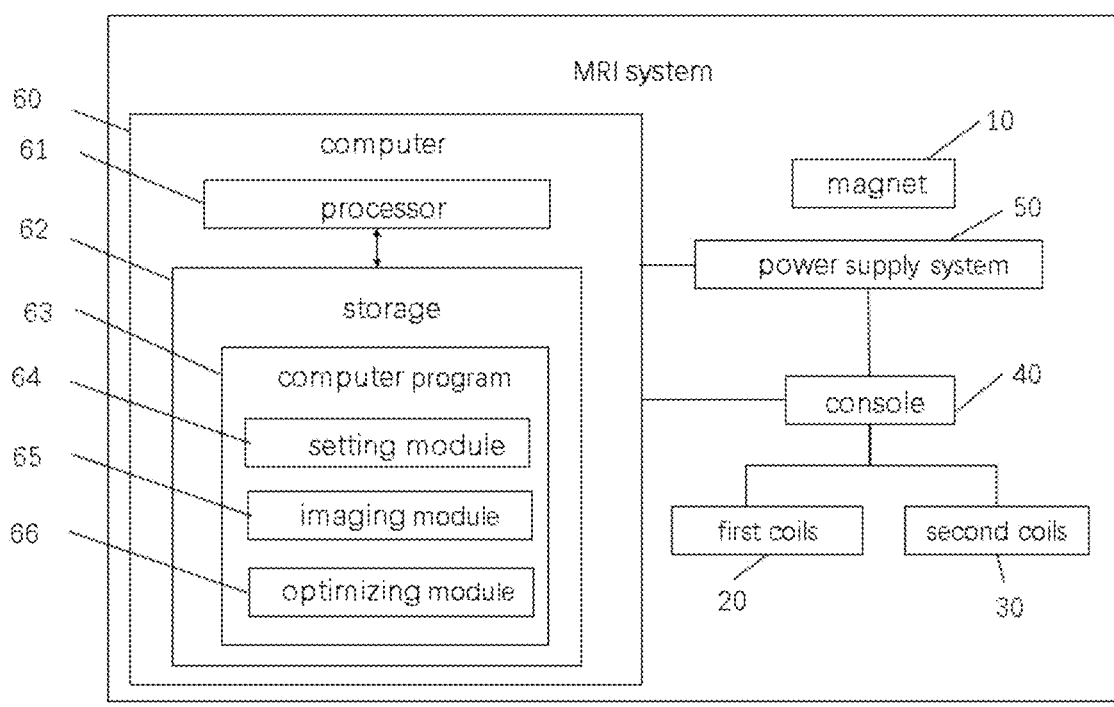
FIG. 2 is a schematic block diagram of a magnetic resonance imaging system for subject with a metal implant according to an embodiment of the present disclosure.

FIG. 2 is a schematic block diagram of a magnetic resonance imaging system for subject with a metal implant according to an embodiment of the present disclosure. The system corresponds to the computer-implemented MRI methods for subject with a metal implant described in the above embodiments.

As shown in FIG. 2, the system includes a magnet 10 to produce static magnetic field $B_0$ ranged from 10 mT to 100 mT, a plurality of first coils 20 to generate and receive RF signal, a plurality of second coils 30 to generate gradient magnetic fields for spatial encoding, a console 40 for controlling the magnetic gradients and RF receiving and transmission, a power supply system 50, and a computer 60 for user interaction.

Particularly, the computer 60 may be PC, laptop, or tablet.

The computer 60 includes at least one computer hardware processor 61, at least one non-transitory computer-readable storage medium 62, and at least one computer program 63 stored in the at least one non-transitory computer-readable storage medium 62 and executable on the at least one computer hardware processor 61. When executing (instructions in) the at least one computer program 63, the at least one computer hardware processor 61 implements the MRI method for subject with metal implants described in the above embodiments shown in FIG. 1.

Exemplarily, the at least one computer program 63 may be divided into one or more modules, and the one or more modules are stored in the at least one non-transitory computer-readable storage medium 62 and executed by the at least one computer hardware processor 61 to realize the present disclosure. The one or more modules may be a series of computer program instruction sections capable of performing a specific function, and the instruction sections are for describing the execution process of the at least one computer program 63 in the system.

In this embodiment, the at least one computer program 63 includes a setting module 64, an imaging module 65 and an optimizing module 66. The setting module 64 is configured to set sequences with optimized parameters of the MR system for minimizing sensitivity to field distortion and improving SNR. The imaging module 65 is configured for imaging with the MR system using the sequences for the subject with a metal implant to obtain MR images. The optimizing module 66 is configured to improve SNR of obtained MR images by deep learning based image reconstruction.

Preferably, the computer program 63 may further include a denoising module, which is configured to further improve the SNR of the reconstructed images.

For the details, references are made to the above descriptions discussed in the methods, which will not be repeated here.

FIGS. 3A to 3E and 4A to 4E show images generated by a magnetic resonance imaging method according to an embodiment of the present invention, in which two coins are placed in a water mold for simulation of metal implants. In FIGS. 3A to 3E, sample images acquired with fast spin echo (FSE) sequence are shown. In FIGS. 4A to 4E, sample images acquired with gradient echo (GRE) are shown. It can be seen from FIGS. 3A to 3E and 4A to 4E that neither FSE nor GRE images exhibit strong metal artifacts. Among them, the performance of FSE images is close to ideal, and the artifacts caused by metal implants are removed.

FIG. 5A to 5C show magnitudes of representative 3D GRE images acquired using the method according to one embodiment of the present disclosure, FIGS. 6A to 6C show phases of representative 3D GRE images acquired using the method according to one embodiment of the present disclosure, wherein two coins are placed in a water mold for simulation of metal implants. As shown in FIGS. 5A to 5C, there are no strong artifacts in the amplitude images. As shown in FIGS. 6A to 6C, the images in the phase image are flat, in which the impact of metal implants are greatly reduced.

In some embodiments, existing techniques for metal artifacts reduction can also be incorporated to partially reduce the in-plane/through-plan distortion. For in-plane field distortion, during readout, View Angle Tilting (VAT) applies a gradient along slice selection direction with its gradient same to that used for slice selection. For through-plane field distortions, Slice Encoding Magnetic Artifact Compensation (SEMAC) and Multi-Acquisition Variable Resonance Image Combination (MAVRIC) apply additional phase encoding along slice direction, which significantly reduces distortion or signal voids and/or pile-ups caused by through-plane field distortion.

In the embodiments provided by the present disclosure, it should be understood that the disclosed method, system, and apparatus (or device) may be implemented in other manners. For example, the above-mentioned system and apparatus embodiment is merely exemplary. For example, the division of modules or units is merely a logical functional division, and other division manner may be used in actual implementations, that is, multiple units or components may be combined or be integrated into another system, or some of the features may be ignored or not performed.

The units described as separate components may or may not be physically separated. The components represented as units may or may not be physical units, that is, may be located in one place or be distributed to multiple network units. Some or all of the units may be selected according to actual needs to achieve the objectives of this embodiment.

In addition, each of the functional units or modules in each of the embodiments of the present disclosure can be integrated in one processing unit. Each unit or modules can physically exist alone, or two or more units can be integrated in one unit, or two or more modules can be integrated in one module. The above-mentioned integrated unit or module can be implemented either in the form of hardware, or in the form of software functional units or modules.

The integrated unit or module can be stored in a computer-readable storage medium if it is implemented in the form of a software functional unit and sold or utilized as a separate product. Based on this understanding, the technical solution of the present disclosure, either essentially or in part, contributes to the prior art, or all or a part of the technical solution can be embodied in the form of a software product. The software product is stored in a storage medium, which includes a number of instructions for enabling a computer device (which can be a personal computer, a server, a network device, etc.) or a processor to execute all or a part of the steps of the methods described in each of the embodiments of the present disclosure. The above-mentioned storage medium includes a variety of media such as a USB disk, a mobile hard disk, a read-only memory (ROM), a random access memory (RAM), a magnetic disk, and an optical disk which is capable of storing program codes.

As mentioned above, the forgoing embodiments are merely intended for describing but not for limiting the technical schemes of the present disclosure. Although the present disclosure is described in detail with reference to the above-mentioned embodiments, it should be understood by those skilled in the art that, the technical schemes in each of the above-mentioned embodiments may still be modified, or some of the technical features may be equivalently replaced, while these modifications or replacements do not make the essence of the corresponding technical schemes depart from the spirit and scope of the technical schemes of each of the embodiments of the present disclosure, and should be included within the scope of the present disclosure.

What is claimed is:

1. A computer-implemented magnetic resonance imaging method for subject with a metal implant, comprising steps of:
    S1: building an ultra-low field MR system with a field strength ranged from 10 to 100 mT;
    S2: setting sequences with optimized parameters of the ultra-low field MR system for minimizing the sensitivity to field distortion and improving SNR;
    S3: magnetic resonance imaging with the ultra-low field MR system using the sequences for the subject with a metal implant to obtain MR images; and
    S4: improving SNR of obtained MR images by deep learning based image reconstruction;
    wherein the step S4 comprises:
    designing and training a deep learning model for image reconstruction;
    wherein inputs of the deep learning model are images with multiple contrasts acquired with identical geometry, and wherein images with multiple contrasts/images are jointly reconstructed.

2. The method of claim 1, wherein the system comprises a magnet for producing static magnetic field $B_0$ ranged from 10 mT to 100 mT, a plurality of first coils for generating and receiving RF signal, a plurality of second coils for generating gradient magnetic fields for spatial encoding, a console for controlling magnetic gradients and RF receiving and transmission, a power supply system, and a computer for user interaction.

3. The method of claim 1, wherein the step S2 comprises a step of minimizing echo spacing for fast spin echo sequence.

4. The method of claim 1, wherein the step S2 comprises a step of maximizing excitation RF bandwidth to reduce through-plane distortion.

5. The method of claim 1, wherein the step S2 comprises a step of maximizing receiver bandwidth to reduce in-plane distortion.

6. The method of claim 1, wherein the step S2 comprises a step of reducing slice thickness and using parallel imaging acceleration.

7. The method of claim 1, wherein the step S2 comprises following steps to improve SNR:
    reducing TR and use of more number of signal averages; and
    optimizing flip angle.

8. The method of claim 1, wherein output of the deep learning model is k-space data for multiple 2D slices or 3D volume.

9. The method of claim 1, wherein outputs of the deep learning model are images for multiple 2D slices or a 3D volume.

10. The method of claim 1, wherein the deep learning model is a convolutional neural network, a generative adversarial network (GAN), or an Auto-Encoder.

11. The method of claim 1, wherein the deep learning model is trained with MR k-space data and/or images through simulation, which are acquired with the same system, or high field systems.

12. The method of claim 1, further comprising a step of:
    denoising reconstructed images obtained from S4 to further improve SNR.

13. The method of claim 1, further comprising View Angle Tilting to further reduce metal-related artifacts.

14. The method of claim 1, further comprising Slice Encoding Magnetic Artifact Compensation or Multi-Acquisition Variable Resonance Image Combination to further reduce metal-related artifacts.

15. A magnetic resonance imaging system for subject with a metal implant, comprising:
    a magnet for producing static magnetic field $B_0$ ranged from 10 mT to 100 mT;
    a plurality of first coils for generating and receiving RF signal;
    a plurality of second coils for generating gradient magnetic fields for spatial encoding;
    a console for controlling magnetic gradients and RF receiving and transmission;
    a power supply system; and
    a computer for user interaction,
    wherein the computer comprises: at least one computer hardware processor; at least one non-transitory computer-readable storage medium; and at least one computer program stored in the at least one non-transitory computer-readable storage medium and executable on the at least one computer hardware processor, and
    wherein when executing the at least one computer program, the at least one computer hardware processor implements the method according to claim 1.

16. The system of claim 15, wherein the at least one computer program comprises:
    a setting module, configured to set sequences with optimized parameters of the MR system for minimizing the sensitivity to field distortion and improving SNR;
    an imaging module, configured for imaging with the MR system using the sequences for the subject with a metal implant to obtain MR images; and
    an optimizing module, configured to improve SNR of obtained MR images by deep learning based image reconstruction.

* * * * *